(12) United States Patent
Tsukio (10) Patent No.: US 11,905,906 B2
(45) Date of Patent: Feb. 20, 2024

(54) LOAD DRIVE DEVICE AND METHOD OF CONTROLLING FUEL INJECTION DEVICE

(71) Applicant: Hitachi Astemo, Ltd., Hitachinaka (JP)

(72) Inventor: Koichi Tsukio, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 441 days.

(21) Appl. No.: 17/297,314

(22) PCT Filed: Nov. 19, 2019

(86) PCT No.: PCT/JP2019/045182
§ 371 (c)(1),
(2) Date: May 26, 2021

(87) PCT Pub. No.: WO2020/110821
PCT Pub. Date: Jun. 4, 2020

(65) Prior Publication Data
US 2022/0034275 A1 Feb. 3, 2022

(30) Foreign Application Priority Data

Nov. 30, 2018 (JP) .................................. 2018-225395

(51) Int. Cl.
*F02D 41/20* (2006.01)
*F02D 41/06* (2006.01)

(52) U.S. Cl.
CPC ........... *F02D 41/20* (2013.01); *F02D 41/062* (2013.01); *F02D 2041/2003* (2013.01);
(Continued)

(58) Field of Classification Search
CPC .................. F02D 41/20; F02D 41/062; F02D 2041/2003; F02D 2041/2051;
(Continued)

(56) References Cited

U.S. PATENT DOCUMENTS 5,970,952 A * 10/1999 Mogi ...................... F02P 17/12
123/406.27
5,983,854 A * 11/1999 Machida ............... F02D 41/266
701/107

(Continued)

FOREIGN PATENT DOCUMENTS

JP 2009-127574 A 6/2009
JP 2012-182949 A 9/2012

(Continued)

OTHER PUBLICATIONS

International Search Report (PCT/ISA/210) issued in PCT Application No. PCT/JP2019/045182 dated Mar. 17, 2020 with English translation (12 pages).

(Continued)

*Primary Examiner* — Sizo B Vilakazi
(74) *Attorney, Agent, or Firm* — Crowell & Moring LLP (57) ABSTRACT

Provided is a load drive device for controlling a fuel injection device for a vehicle engine and capable of checking an operation of the fuel injection device with high reliability without actually injecting fuel before starting the engine. The load drive device includes: a first switching element that is connected to a high-side of a load; a second switching element that is connected to a low-side of the load; a pre-driver circuit that transmits a drive instruction to the first switching element and the second switching element; and an arithmetic device that transmits a control instruction to the pre-driver circuit, in which a first monitor line and a second monitor line are connected to the arithmetic device, the first monitor line monitoring the drive instruction from the pre-driver circuit to the first switching element before starting an engine, and the second monitor line monitoring the drive instruction from the pre-driver circuit to the second switching element, and the pre-driver circuit has a first control mode in which the first switching element is turned (Continued)

off and the drive instruction is transmitted to the second switching element, and a second control mode in which the second switching element is turned off and the drive instruction is transmitted to the first switching element.

10 Claims, 6 Drawing Sheets

(52) U.S. Cl.
CPC ............... *F02D 2041/2051* (2013.01); *F02D 2041/2086* (2013.01); *F02D 2200/503* (2013.01)

(58) Field of Classification Search
CPC ....... F02D 2041/2086; F02D 2200/503; F02D 2041/2075; F02D 41/22; H03K 17/00
See application file for complete search history.

(56) References Cited

U.S. PATENT DOCUMENTS

| | | | |
|---|---|---|---|
| 11,639,696 B2* | 5/2023 | Nilsson | F02D 41/221 |
| | | | 123/478 |
| 2009/0138176 A1* | 5/2009 | Murakami | F02D 41/22 |
| | | | 701/114 |
| 2017/0077922 A1 | 3/2017 | Miura et al. | |
| 2017/0226950 A1 | 8/2017 | Tanaka | |
| 2018/0010545 A1* | 1/2018 | Mukaihara | F02D 41/402 |

FOREIGN PATENT DOCUMENTS

| | | |
|---|---|---|
| JP | 2016-37870 A | 3/2016 |
| JP | 2016-201661 A | 12/2016 |
| JP | 2017-44087 A | 3/2017 |
| JP | 2017-59979 A | 3/2017 |
| JP | 2017-210936 A | 11/2017 |
| WO | WO 2016/167185 A1 | 10/2016 |

OTHER PUBLICATIONS

Japanese-language Written Opinion (PCT/ISA/237) issued in PCT Application No. PCT/JP2019/045182 dated Mar. 17, 2020 (six (6) pages).

* cited by examiner

LOAD DRIVE DEVICE AND METHOD OF CONTROLLING FUEL INJECTION DEVICE

TECHNICAL FIELD

The present invention relates to a configuration of a load drive device and a control thereof, and more particularly, to an effective technique applied to a drive device of a fuel injection device for a vehicle engine and a control thereof.

BACKGROUND ART

An electronic control block of a vehicle is composed of various sensors for detecting necessary information such as an engine condition or driving environment, an electronic control unit (ECU) that instantaneously performs arithmetic processing on various information obtained from the various sensors and outputs optimum control information, and an actuator (drive device) that is driven in accordance with the optimum control information, and the optimum control of each electronic control system is performed in conjunction with the electronic control unit and the actuator.

Actuators such as engine ignitors (ignition devices), injectors (fuel injection devices), or an antilock brake system (ABS) are electrical loads, and the ECU is a load drive device driving the electrical loads.

Meanwhile, when an abnormality occurs in a drive system of a vehicle, a failsafe is used to stop the engine by performing an emergency stop on the injector (fuel injection device). A pre-driver reset mechanism for stopping a pre-driver is used as a method of performing the emergency stop on the injector (fuel injection device), but it is required to diagnose that an emergency stop mechanism is operating normally as a functional safety requirement.

As a conventional technique for controlling the injector (fuel injection device), for example, a technique as described in PTL 1 is used. PTL 1 discloses that "a fuel injection control device for an internal combustion engine configured to feed a pre-charge current smaller than a current for operating a valve body to the electromagnetic part in a pre-charge period at the beginning of a start of energization during injecting fuel, and subsequently feed a drive current for operating the valve body to the electromagnetic part, the fuel injection control device including: a parameter acquisition unit that acquires a current change parameter which is a parameter correlated with a speed of a rising change in the drive current; and a pre-charge control unit that controls the feed of the pre-charge current to the electromagnetic part, based on the current change parameter acquired by the parameter acquisition unit.

CITATION LIST

Patent Literature

PTL 1: JP 2016-037870 A

SUMMARY OF INVENTION

Technical Problem

As described above, it is required for the load drive device (electronic control unit) controlling drive of the injector (fuel injection device) to diagnose that the emergency stop mechanism is operating normally as a functional safety requirement, and conventionally, the load drive device (electronic control unit) is implemented by using a function of a specific IC mounted as a pre-driver of the injector (fuel injection device).

For example, when a function is provided, as a function of the pre-driver IC of the injector (fuel injection device), that a pre-driver control unit issues a command to a pre-driver unit that performs a gate control of a driver, and at the same time, outputs an enable signal to the outside of the IC, it can be diagnosed whether or not injector injection is performed by replacing the output of the enable signal with the injection of the injector ("enable output=injector injection"). In that case, an injector control current is controlled with a current as low as about 1 A so that the injector does not actually inject fuel.

However, the conventional technique as described above has problems such as (1) it is impossible to deal with a case where the pre-driver IC does not have an enable function, (2) when an injector current is actually monitored, it is required to monitor a minute small voltage of about 10 mV that exceeds reading accuracy of an MPU, and (3) since all the control currents of the injector are not necessarily about 1 A, it is required to define a current that prevents the injector from injecting every time the injector specifications are changed.

The technique of PTL 1 suppresses variation in a fuel injection amount due to an instrumental error of the fuel injection device, and does not mention a diagnosis of the emergency stop mechanism of the injector (fuel injection device).

Therefore, an object of the present invention is to provide a load drive device for controlling a fuel injection device for a vehicle engine and capable of checking an operation of a fuel injection device with high reliability without actually injecting fuel before starting the engine, and a method of controlling the fuel injection device using the load drive device.

Solution to Problem

In order to solve the problem, a load drive device of the present invention includes a first switching element that is connected to a high-side of a load; a second switching element that is connected to a low-side of the load; a pre-driver circuit that transmits a drive instruction to the first switching element and the second switching element; and an arithmetic device that transmits a control instruction to the pre-driver circuit, in which a first monitor line and the second monitor line are connected to the arithmetic device, the first monitor line monitoring the drive instruction from the pre-driver circuit to the first switching element, and the second monitor line monitoring the drive instruction from the pre-driver circuit to the second switching element, and the pre-driver circuit has a first control mode in which the first switching element is turned off and the drive instruction is transmitted to the second switching element before starting an engine, and a second control mode in which the second switching element is turned off and the drive instruction is transmitted to the first switching element.

Further, a load drive device according to the present invention includes: a first switching element that is connected to a high-side of a load; a second switching element that is connected to a low-side of the load; a pre-driver circuit that transmits a drive instruction to the first switching element and the second switching element; an arithmetic device that transmits a control instruction to the pre-driver circuit; and a current cut-off circuit that is provided at least one of between the first switching element and a power supply and between the second switching element and a ground, and directly controlled by the arithmetic device, in which the current cut-off circuit is turned off by the arithmetic device before starting the engine, the current cut-off circuit being provided at least one of between the first switching element and the power supply and between the second switching element and the ground.

Further, a load drive device according to the present invention includes: a first switching element that is connected to a high-side of a load; a second switching element that is connected to a low-side of the load; a pre-driver circuit that transmits a drive instruction to the first switching element and the second switching element; and an arithmetic device that transmits a control instruction to the pre-driver circuit, in which a monitor line for monitoring a difference in a voltage across the load is connected to the arithmetic device, and the arithmetic device monitors the differentiated voltage across the load.

Further, a method of controlling a fuel injection device according to the present invention includes: turning off a high-side driver before starting an engine; operating a pre-driver to output a gate signal to the low-side driver; monitoring the gate signal output to the low-side by the CPU via a voltage drop circuit; turning off a low-side driver; operating the pre-driver to output a gate signal to the high-side driver; monitoring the gate signal output to the high-side by the CPU via the voltage drop circuit; and diagnosing a pre-driver reset mechanism of the pre-driver based on a state of each of the gate signals when the pre-driver is reset to the low-side driver and when the pre-driver is reset to the high-side driver Further, a method of controlling a fuel injection device according to the present invention includes: detecting a difference in a voltage across the fuel injection device before starting an engine; and diagnosing a pre-driver reset mechanism of a pre-driver based on the detected difference.

Advantageous Effects of Invention

According to the present invention, it is possible to implement a load drive device for controlling a fuel injection device for a vehicle engine and capable of checking an operation of a fuel injection device with high reliability without actually injecting fuel before starting the engine, and a method of controlling the fuel injection device using the load drive device.

A problem, a configuration, and an effect other than the above-described will be made to be apparent by a description of the following embodiments.

DESCRIPTION OF EMBODIMENTS

Hereinafter, embodiments of the present invention will be described with reference to the drawings. In each drawing, the same components are denoted by the same reference signs, and the detailed description of overlapping portions will be omitted.

First Embodiment

A load drive device (electronic control unit) according to a first embodiment of the present invention and a control thereof will be described with reference to FIGS. 1 to 3.

Figure 1:
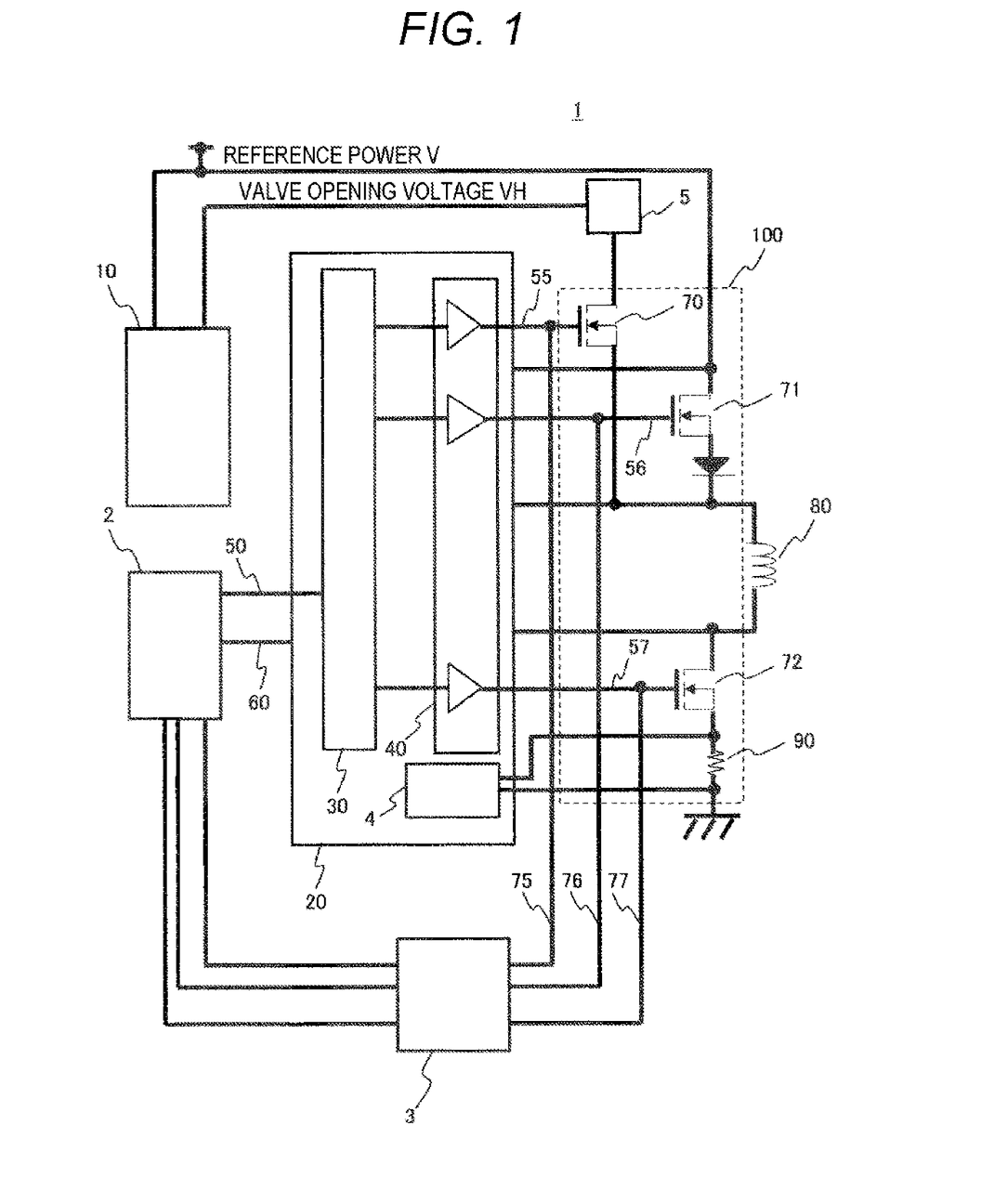
FIG. 1 is a circuit configuration diagram illustrating a configuration of a load drive device according to a first embodiment of the present invention.
Figure 2A:
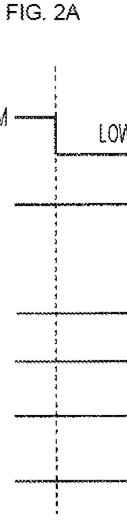
FIGS. 2A-2F constitute a timing chart illustrating an example of an operation of the load drive device according to the first embodiment of the present invention.
Figure 2B:
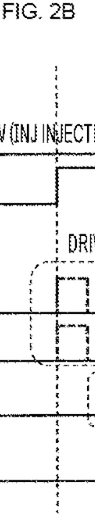
Figure 2C:
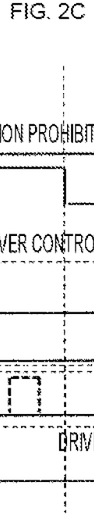
Figure 2D:
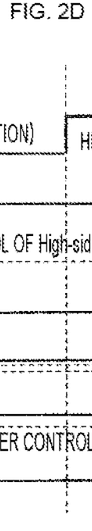
Figure 2E:
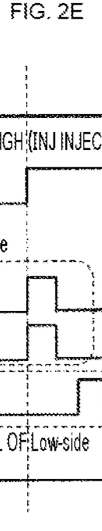
Figure 2F:
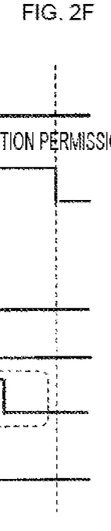

FIG. 1 illustrates a circuit configuration of the load drive device (electronic control unit) according to the present embodiment. A load drive device 1 of the present embodiment includes, as main components, an injector valve opening driver 70 and an injector valve opening-holding driver that are connected to a high-side of an injector (fuel injection device) 80 as a load, an injector low-side driver 72 that is connected to a low-side of the injector (fuel injection device) 80, a pre-driver circuit (pre-driver IC) 20 that transmits a drive instruction to each of the drivers 70 to 72, and an arithmetic device (CPU) 2 that transmits a control instruction to the pre-driver circuit 20.

Hereinafter, the injector valve opening driver 70, the injector valve opening-holding driver 71, and the injector low-side driver 72 are also referred to as a "driver B", a "driver A", and a "driver C", respectively. A switching element such as an insulated gate bipolar transistor (IGBT) is used for each of the drivers 70 to 72.

The arithmetic device (CPU) 2 transmits the control instruction (control signal) for controlling each of the drivers 70 to 72 to the pre-driver circuit 20 via an injection command signal line 50 and a pre-driver stopping reset signal line 60.

The pre-driver circuit 20 includes, as main components, a pre-driver 40 and a pre-driver controller 30 controlling the pre-driver 40, and transmits the drive instruction (drive signal) for driving each of the drivers 70 to 72 to each of the drivers 70 to 72 based on the control instruction (control signal) such as an injection command (instruction) input from the arithmetic device (CPU) 2. In addition, the pre-driver circuit 20 is reset based on the pre-driver stopping reset command (instruction) input from the arithmetic device (CPU) 2.

The injector low-side driver 72 is connected to the low-side of the injector (fuel injection device) 80 and is grounded to a ground via an injector current monitor 90. The injector current monitor 90 detects a current value flowing through the injector (fuel injection device) 80 when the injector (fuel injection device) 80 is driven. An injector circuit 100 includes the injector current monitor 90, injector valve opening driver 70, the injector valve opening-holding driver 71, and the injector low-side driver 72.

In the present embodiment, a current monitor 4 is disposed in the pre-driver circuit 20, and the pre-driver circuit 20 can be controlled by transmitting a detection value of the injector current monitor 90 to the current monitor 4, based on the detection current of the injector current monitor 90.

The injector valve opening driver 70 is connected to the high-side of the injector (fuel injection device) 80 and connected to an injector valve opening power supply device 10 via a DC/DC converter 5 to input a power supply voltage (valve opening voltage VH) boosted by the DC/DC converter 5 to the injector valve opening driver 70.

The injector valve opening-holding driver 71 is connected to the high-side of the injector (fuel injection device) 80 and connected to the injector valve opening power supply device 10 to input a power supply voltage (reference power V).

Each gate of the drivers 70 to 72 is connected to the pre-driver circuit 20 by gate signal lines 55 to 57, and switching drive is performed based on the drive instruction (drive signal) input from the pre-driver 40 in the pre-driver circuit 20.

Each of the gate signal lines 55 to 57 is connected to the arithmetic device (CPU) 2 by gate monitor lines 75 to 77, the drive instruction (drive signal) output from the pre-driver 40 can be loaded into the arithmetic device (CPU) 2 via a voltage drop circuit (voltage conversion circuit) 3 to control the pre-driver circuit 20 while monitoring the voltage-converted drive instruction (drive signal).

The representative operation (action) of the load drive device 1 of FIG. 1 will be described with reference to FIGS. 2 and 3.

First, a high-side driver (both or one of the injector valve opening driver 70 and the injector valve opening-holding driver 71) is turned off (energization path of the injector 80 is interrupted) before starting an engine. (Step S1)

Next, the pre-driver 40 is operated to output a gate signal to a low-side driver (injector low-side driver 72). (Step S2)

Subsequently, the gate signal output to the low-side driver (injector low-side driver 72) is monitored by the arithmetic device (CPU) 2 via the voltage drop circuit 3. (Step S3)

Here, a control of Step S1 to Step S3 is referred to as a "first control mode".

Next, the low-side driver (injector low-side driver 72) is turned off (energization path of the injector 80 is interrupted). (Step S4)

Subsequently, the pre-driver 40 is operated to output a gate signal to a high-side driver (both or one of the injector valve opening driver 70 and the injector valve opening-holding driver 71). (Step S5)

Next, the arithmetic device (CPU) 2 monitors, via the voltage drop circuit 3, the gate signal output to the high-side driver (both or one of the injector valve opening driver 70 and the injector valve opening-holding driver 71). (Step S6)

Here, a control of Step S4 to Step S6 is referred to as a "second control mode".

Subsequently, a driver reset mechanism of the pre-driver 40 is diagnosed based on a state of each of the gate signals when the pre-driver is reset to the low-side driver and when the pre-driver is reset to the high-side driver. (Step S7)

As a more preferable example, it is possible to diagnose the driver reset mechanism of the pre-driver by detecting a difference in a voltage across a load (injector 80), based on the detected difference and the state of each of the gate signals when the pre-driver is reset to the low-side driver and when the pre-driver is reset to the high-side driver.

In this case, the arithmetic device (CPU) 2 monitors the differentiated voltage across the load (injector 80). Accordingly, a diagnosis with higher accuracy can be performed.

As a modification, under a condition in which a current that prevents the valve from opening (fuel from being injected) is applied to the load before starting the engine, the difference in the voltage across the load (injector 80) when the pre-driver is reset to the low-side driver is detected, and thus it is possible to diagnose whether the driver reset mechanism of the pre-driver functions based on the detected difference, without performing Step S1 to Step S7 described above. When a current detection circuit is used as in the conventional case, it is necessary to energize a minute current that prevents the fuel from being injected (the injector from opening the valve), and convert the minute current into a voltage and monitor the voltage. In this case, in order to accurately read a small current with a microcomputer, it is necessary to read the small current with a large resistance, which affects the control. On the other hand, if the current is read with a small resistance that does not affect the control, there is a possibility of an erroneous detection due to the too small voltage to be monitored and the resistance is added, which also affects the control. Meanwhile, since the difference in the voltage across the load is detected to perform the diagnosis by replacing the resistance of the load with a resistance for current detection, it does not need to add a new resistance, such that influence on the control can be reduced, and the resistance of the load is increased, such that a driver reset diagnosis can be performed accurately.

When it is detected that the gate signal when the pre-driver is reset to the low-side driver does not rise and the gate signal when the pre-driver is reset to the high-side driver rises, it is determined that the driver reset mechanism of the pre-driver 40 is normal. (Step S8)

On the other hand, in other cases, it is determined that the driver reset mechanism of the pre-driver 40 is abnormal. (Step S9)

As illustrated in FIG. 2, the arithmetic device (CPU) 2 transmits an injection prohibition instruction to the pre-driver circuit 20, the pre-driver circuit 20 controls not to transmit the drive instruction to each switching element in an injection prohibition period of the injection prohibition instruction, and when the drive instruction is detected in the injection prohibition period, the arithmetic device (CPU) 2 determines that the control of the pre-driver circuit 20 is abnormal.

As described above, the load drive device 1 of the present embodiment includes the first switching element (injector valve opening-holding driver 71) that is connected to the high-side of the load (injector 80), a second switching element (injector low-side driver 72) that is connected to the low-side of the load (injector 80), the pre-driver circuit 20 that transmits the drive instruction to the first switching element (injector valve opening-holding driver 71) and the second switching element (injector low-side driver 72), and the arithmetic device (CPU) 2 that transmits the control instruction to the pre-driver circuit 20. A first monitor line (gate monitor line 76) and a second monitor line (gate monitor line 77) are connected to the arithmetic device (CPU) 2, the first monitor line (gate monitor line 76) monitoring the drive instruction from the pre-driver circuit 20 to the first switching element (injector valve opening-holding driver 71), and the second monitor line (gate monitor line 77) monitoring the drive instruction from the pre-driver circuit 20 to the second switching element (injector low-side driver 72). The pre-driver circuit 20 has the "first control mode" in which the first switching element (injector valve opening-holding driver 71) is turned off and the drive instruction is transmitted to the second switching element (injector low-side driver 72) before starting the engine, and the "second control mode" in which the second switching element (injector low-side driver 72) is turned off and the drive instruction is transmitted to the first switching element (injector valve opening-holding driver 71).

Further, the voltage drop circuit (voltage conversion circuit) 3 that converts a signal voltage from the pre-driver circuit 20 is disposed on the first monitor line (gate monitor line 76) and the second monitor line (gate monitor line 77), and the voltage drop circuit (voltage conversion circuit) 3 converts the signal voltage to a voltage for loading into the arithmetic device (CPU) 2, and inputs, to the arithmetic device (CPU) 2, a signal converted by the voltage drop circuit (voltage conversion circuit) 3. The voltage drop circuit (voltage conversion circuit) 3 can drop the gate voltage up to a voltage that can be loaded into the CPU when the gate voltage is a voltage that is not directly loaded into the CPU.

Further, the load drive device 1 of the present embodiment includes a third switching element (injector valve opening driver 70) that is connected to the high-side of the load (injector 80). A battery voltage (reference power V) is input to the first switching element (injector valve opening-holding driver 71), and a voltage (valve opening voltage VH) boosted by the DC/DC converter 5 is input to the third switching element (injector valve opening driver 70), and the third switching element (injector valve opening driver 70) is operated by the drive instruction from the pre-driver circuit 20, and the pre-driver circuit 20 transmits the drive instruction to the third switching element (injector valve opening driver 70) while the second switching element (injector low-side driver 72) is in an off before starting the engine, and transmits the drive instruction to the second switching element (injector low-side driver 72) while the first switching element (injector valve opening-holding driver 71) and the third switching element (injector valve opening driver 70) is in an off state.

As a result, when diagnosing the high-side driver (upper driver), the low-side driver (lower driver) is turned off to cut off the injector energization, and therefore, it is possible to perform a diagnosis before starting the pre-driver without the valve opening of the injector (fuel injection device).

On the contrary, when diagnosing the low-side driver (lower driver), the high-side driver (upper driver) is turned off to cut off the injector energization, and therefore, it is possible to perform the diagnosis before starting the pre-driver without the valve opening of the injector (fuel injection device).

As a result, it possible to check the operation of the fuel injection device without actually injecting the fuel before starting the engine.

Second Embodiment

Figure 4:
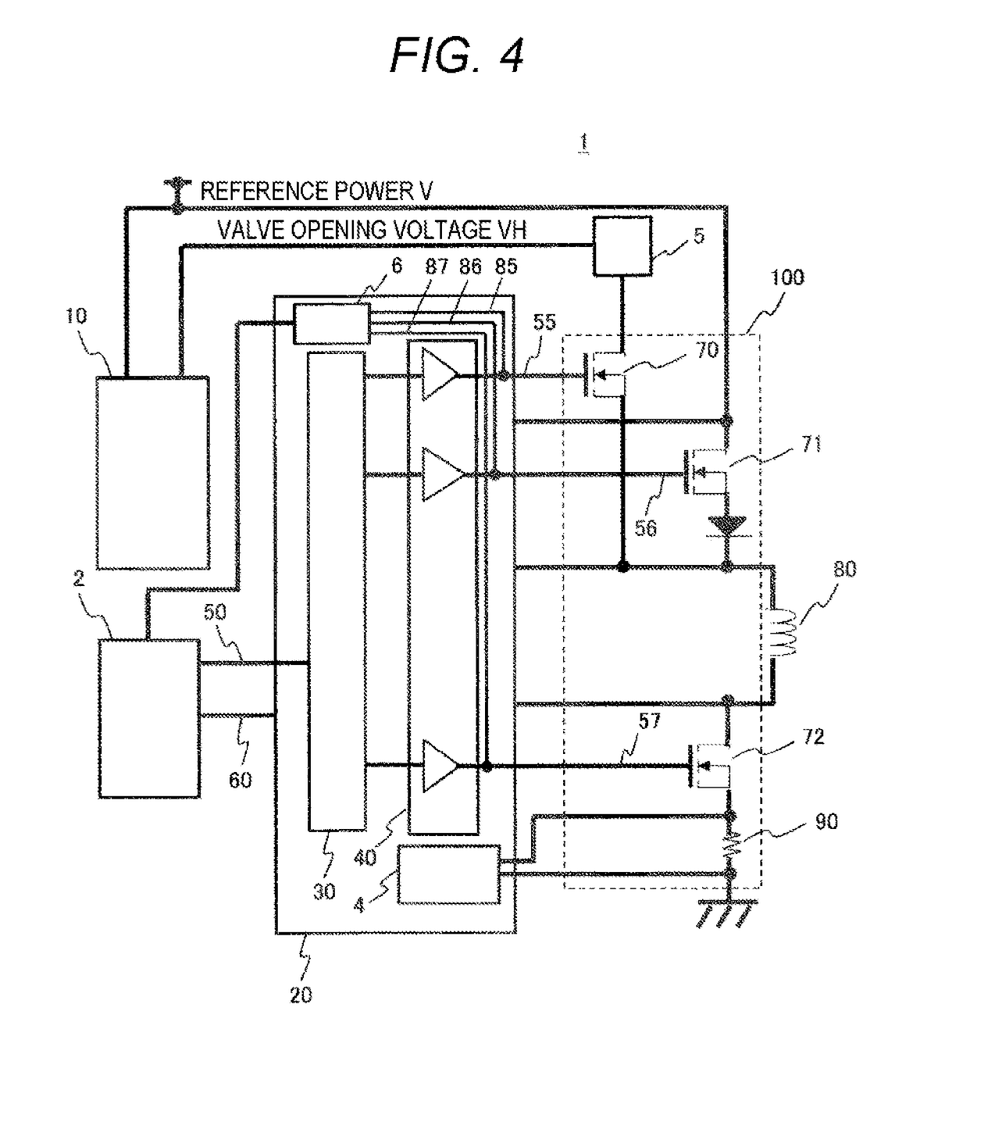
FIG. 4 is a circuit configuration diagram illustrating a configuration of a load drive device according to a second embodiment of the present invention.

A load drive device (electronic control unit) according to a second embodiment of the present invention will be described with reference to FIG. 4. The load drive device 1 of the present embodiment is different from the load drive device of the first embodiment in that in the first embodiment, the voltage drop circuit (voltage conversion circuit) 3 is disposed separately from the pre-driver circuit (pre-driver IC) 20, whereas in the present embodiment, a voltage drop circuit (voltage conversion circuit) 6 is built in the pre-driver circuit (pre-driver IC) 20. Since the other configurations are the same as those in FIG. 1 of the first embodiment, the repeated description will be omitted.

In the present embodiment, each of the gate signal lines 55 to 57 is connected to the arithmetic device (CPU) 2 by gate monitor lines 85 to 87, the drive instruction (drive signal) output from the pre-driver 40 is loaded into the arithmetic device (CPU) 2 via the voltage drop circuit (voltage conversion circuit) 6 to control the pre-driver circuit 20 while monitoring the voltage-converted drive instruction (drive signal).

According to the present embodiment, the pre-driver IC has a voltage drop (voltage conversion) function in addition to the effect of the first embodiment, the external voltage drop circuit (voltage conversion circuit) 3 is thus not required. Therefore, it is possible to simplify the circuit configuration of the load drive device and reduce costs.

Third Embodiment

Figure 5:
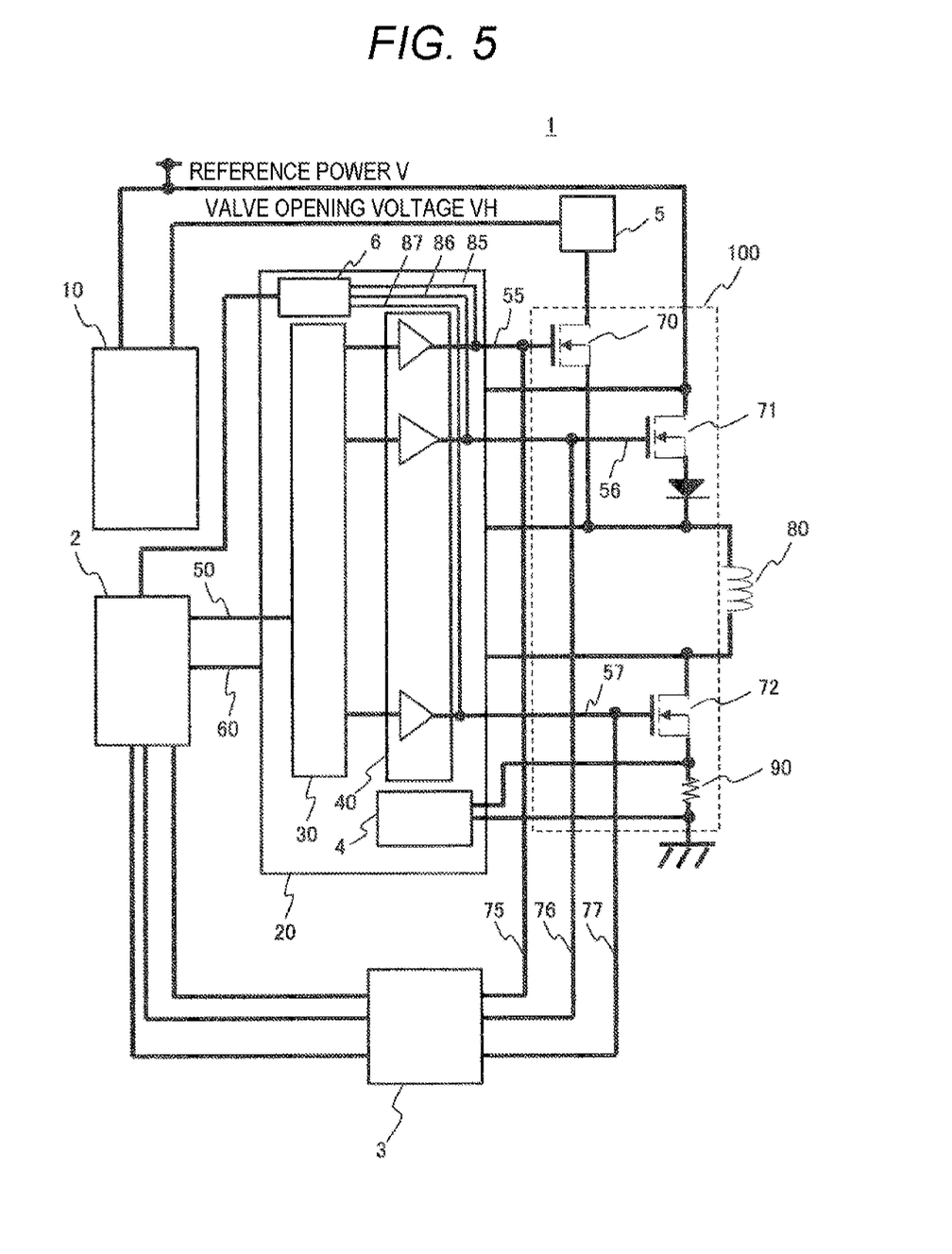
FIG. 5 is a circuit configuration diagram illustrating a configuration of a load drive device according to a third embodiment of the present invention.

A load drive device (electronic control unit) according to a third embodiment of the present invention will be described with reference to FIG. 5. The load drive device 1 of the present embodiment is different from the load drive devices of the first and second embodiments in that the load drive device 1 of the present embodiment includes both the voltage drop circuit (voltage conversion circuit) 3 of the first embodiment and the voltage drop circuit (voltage conversion circuit) 6 of the second embodiment. Since the other configurations are the same as those in FIG. 1 of the first embodiment, the repeated description will be omitted.

As in the present embodiment, the load drive device 1 includes both the voltage drop circuit (voltage conversion circuit) 3 disposed separately from the pre-driver circuit (pre-driver IC) 20 and the voltage drop circuit (voltage conversion circuit) 6 built in the pre-driver circuit (pre-driver IC) 20, such that even when an abnormality occurs in one of the voltage drop circuits (voltage conversion circuits), it is possible to continuously perform the diagnosis before starting the pre-driver 40 and secure an emergency stop operation of the injector (fuel injection device).

Fourth Embodiment

A load drive device (electronic control unit) according to a fourth embodiment of the present invention will be described with reference to FIG. 6. The load drive device 1 of the present embodiment is different from the load drive device of the third embodiment in that in addition to the configuration of the third embodiment (FIG. 6), injection stop circuits (current cut-off circuits) 7 and 8 that interrupt the energization path of the injector 80 are disposed between the injector valve opening driver 70 and the injector valve opening-holding driver 71 and the injector valve opening power supply device 10 and between the injector low-side driver 72 and a ground, respectively. Since the other configurations are the same as those in FIG. 5 of the third embodiment, the repeated description will be omitted.

The load drive device 1 of the present embodiment includes an injection stop circuit (current cut-off circuit) 7 or 8 that is provided at least one of between the first switching element (injector valve opening-holding driver 71) and the third switching element (injector valve opening driver 70) and a power supply (injector valve opening power supply device 10) and between the second switching element (injector low-side driver 72) and a ground, and directly controlled by the arithmetic device (CPU) 2. The injection stop circuits (current cut-off circuits) 7 and 8 are turned off in the first control mode (Step S1 to Step S3 in FIG. 3) before starting the engine and the second control mode (Step S4 to Step S6 in FIG. 3).

As in the present embodiment, the injection stop circuits (current cut-off circuit) 7 and 8 that cut off the supply of the drive current to the injector 80 is provided to perform control, by the arithmetic device (CPU) 2, based on an injection stop (current cut-off) signal input via current cut-off mechanism control signal lines 95 and 96. As a result, when diagnosing a pre-driver reset mechanism of the pre-driver 40, the injection stop circuits (current cut-off circuits) 7 and 8 can certainly stop either the drivers 70 and 71 connected to the high-side or the driver 72 connected to the low-side, in addition to turning off of the driver (switching element).

Figure 6:
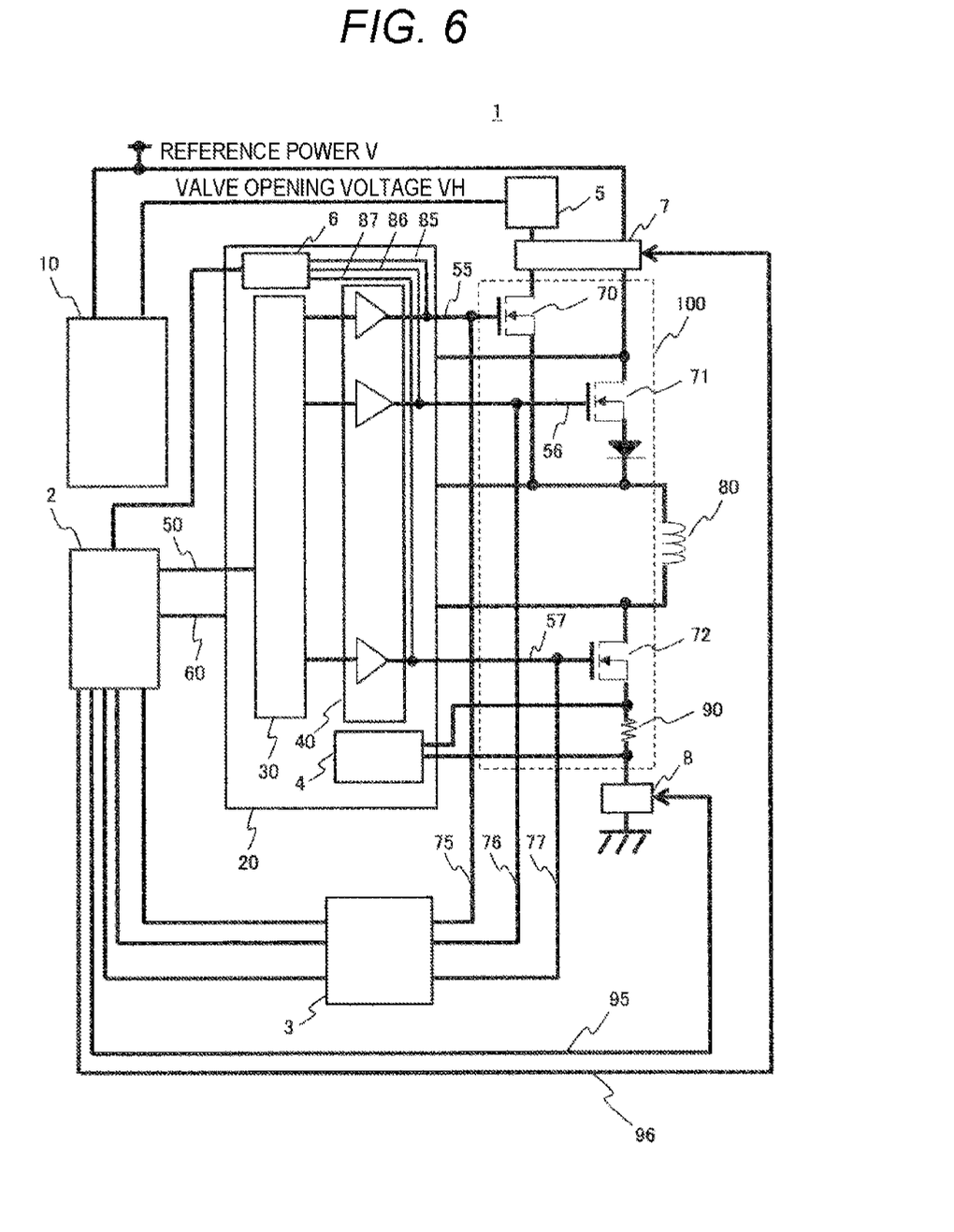
FIG. 6 is a circuit configuration diagram illustrating a configuration of a load drive device according to a fourth embodiment of the present invention.

In FIG. 6, the injection stop circuit (current cut-off circuit) 7 or 8 is provided on both the high-side and the low-side, but may be provided on either the high-side or the low-side.

Figure 3:
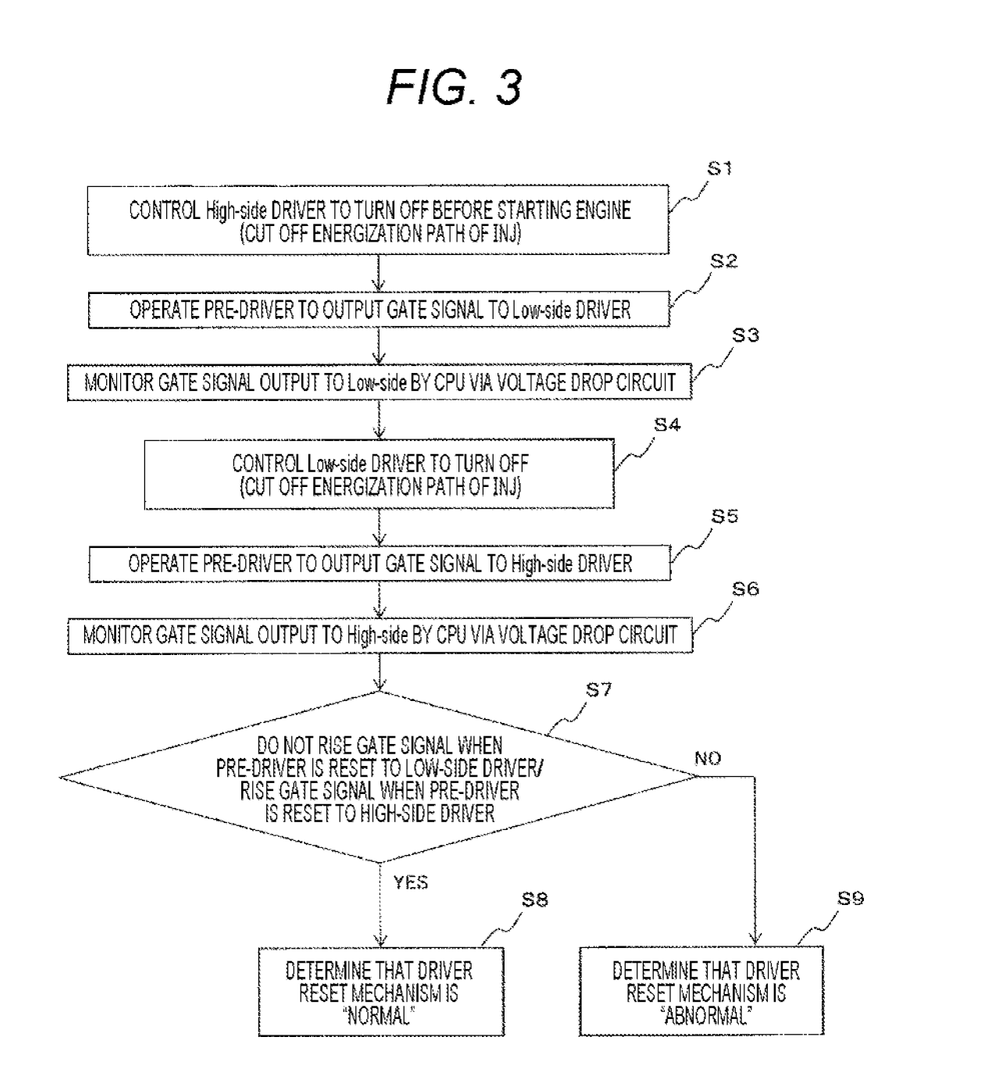
FIG. 3 is a flowchart illustrating an abnormality determination method by the load drive device according to the first embodiment of the present invention.

In this case, the arithmetic device (CPU) 2 can turn off the injection stop circuit (current cut-off circuit) 7 or 8 provided on either the high-side or the low-side to diagnosis the pre-driver reset mechanism of the pre-driver, without performing Steps S1 to S7 in FIG. 3.

In each embodiment described above, "before starting the engine" means a timing before the injector (fuel injection device) 80 actually injects fuel, and is not limited to a specific timing such as a timing when an igniter (ignition device) is turned on or a timing when the engine is completely exploded.

The present invention is not limited to the above embodiment, and various modifications are included.

For example, the above embodiment has been described in detail to facilitate understanding of the present invention, and the present invention is not limited to a configuration necessarily including all the components described above. In addition, some components of a certain embodiment may be replaced with components of another embodiment. In addition, components of another embodiment may be added to components of a certain embodiment. In addition, a part of the configuration of each embodiment may be added, deleted, or replaced by that of a different configuration.

REFERENCE SIGNS LIST

1 load drive device (electronic control unit)
2 arithmetic device (CPU)
3, 6 voltage drop circuit (voltage conversion circuit)
4 current monitor
5 DC/DC converter
7, 8 injection stop circuit (current cut-off circuit)
10 (injector valve opening) power supply device
20 pre-driver circuit (pre-driver IC)
30 pre-driver controller
40 pre-driver
50 injection command signal line
55 gate signal line (B)
56 gate signal line (A)
57 gate signal line (C)
60 (pre-driver stopping) reset signal line
70 (injector valve opening) driver B
71 (injector valve opening-holding) driver A
72 (injector low-side) driver C
75, 85 gate monitor line (B)
76, 86 gate monitor line (A)
77, 87 gate monitor line (C)
80 injector (fuel injection device)
90 (injector) current monitor
95, 96 current cut-off mechanism control signal line
100 injector circuit

The invention claimed is:

1. A load drive device comprising:
a first switching element that is connected to a high-side of a load;
a second switching element that is connected to a low-side of the load;
a pre-driver circuit that transmits a drive instruction to the first switching element and the second switching element; and
an arithmetic device that transmits a control instruction to the pre-driver circuit,
wherein
a first monitor line and the second monitor line are connected to the arithmetic device, the first monitor line monitoring the drive instruction from the pre-driver circuit to the first switching element, and the second monitor line monitoring the drive instruction from the pre-driver circuit to the second switching element, and
the pre-driver circuit has a first control mode in which the first switching element is turned off and the drive instruction is transmitted to the second switching element before starting an engine, and a second control mode in which the second switching element is turned off and the drive instruction is transmitted to the first switching element.

2. The load drive device according to claim 1, wherein
a voltage conversion circuit that converts a signal voltage from the pre-driver circuit is disposed on the first monitor line and the second monitor line,
the voltage conversion circuit converts the signal voltage to a voltage for loading into the arithmetic device, and
a signal converted by the voltage conversion circuit is input to the arithmetic device.

3. The load drive device according to claim 2, wherein the voltage conversion circuit is built in the pre-driver circuit.

4. The load drive device according to claim 1, further comprising a third switching element that is connected to the high-side of the load,
wherein
a battery voltage is input to the first switching element,
a boosted voltage is input to the third switching element,
the third switching element is operated by the drive instruction from the pre-driver circuit, and
the pre-driver circuit transmits the drive instruction to the third switching element while the second switching element is in an off state, and transmits the drive instruction to the second switching element while the first switching and the third switching element are in an off state, before starting the engine.

5. The load drive device according to claim 1, wherein
the arithmetic device transmits an injection prohibition instruction to the pre-driver circuit,
the pre-driver circuit controls not to transmit the drive instruction to each switching element in an injection prohibition period of the injection prohibition instruction, and
when the drive instruction is detected in the injection prohibition period, the arithmetic device determines that the control of the pre-driver circuit is abnormal.

6. A load drive device comprising:
a first switching element that is connected to a high-side of a load;
a second switching element that is connected to a low-side of the load;

a pre-driver circuit that transmits a drive instruction to the first switching element and the second switching element;

an arithmetic device that transmits a control instruction to the pre-driver circuit; and a current cut-off circuit that is provided at least one of between the first switching element and a power supply and between the second switching element and a ground, and directly controlled by the arithmetic device, wherein the arithmetic device turns off the current cut-off circuit provided at least one of between the first switching element and the power supply and between the second switching element and the ground, before starting the engine.

7. A load drive device comprising:

a first switching element that is connected to a high-side of a load;

a second switching element that is connected to a low-side of the load;

a pre-driver circuit that transmits a drive instruction to the first switching element and the second switching element; and an arithmetic device that transmits a control instruction to the pre-driver circuit, wherein a monitor line for monitoring a difference in a voltage across the load is connected to the arithmetic device, and the arithmetic device monitors the differentiated voltage across the load.

8. A method of controlling a fuel injection device, comprising:

turning off a high-side driver before starting an engine;

operating a pre-driver to output a gate signal to a low-side driver;

monitoring the gate signal output to the low-side by a CPU via a voltage drop circuit;

turning off the low-side driver;

operating the pre-driver to output a gate signal to the high-side driver;

monitoring the gate signal output to the high-side by the CPU via the voltage drop circuit; and diagnosing a pre-driver reset mechanism of the pre-driver based on a state of each of the gate signals when the pre-driver is reset to the low-side driver and when the pre-driver is reset to the high-side driver.

9. The method of controlling a fuel injection device according to claim 8, wherein when it is detected that the gate signal when the pre-driver is reset to the low-side driver does not rise and the gate signal when the pre-driver is reset to the high-side driver rises, it is determined that the driver reset mechanism of the pre-driver is normal.

10. A method of controlling a fuel injection device, comprising:

detecting a difference in a voltage across the fuel injection device before starting an engine; and diagnosing a pre-driver reset mechanism of a pre-driver based on the detected difference.

* * * * *